United States Patent
Matsuda et al.

(10) Patent No.: US 8,720,022 B2
(45) Date of Patent: May 13, 2014

(54) METHOD OF PRODUCING AN ACOUSTIC WAVE DEVICE

(75) Inventors: Satoru Matsuda, Kawasaki (JP); Michio Miura, Kawaski (JP); Takashi Matsuda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 12/647,071

(22) Filed: Dec. 24, 2009

(65) Prior Publication Data

US 2010/0244624 A1  Sep. 30, 2010

(30) Foreign Application Priority Data

Mar. 25, 2009 (JP) .................................. 2009-074041

(51) Int. Cl.
*H03H 3/013* (2006.01)
*H01L 41/047* (2006.01)

(52) U.S. Cl.
USPC ............... 29/25.35; 29/594; 29/593; 29/846; 310/313 B; 310/320; 310/322; 333/193

(58) Field of Classification Search
USPC ......... 29/594, 593, 25.35, 846, 842; 310/312, 310/313 B, 320, 322; 333/193, 195
See application file for complete search history.

(56) References Cited

U.S. PATENT DOCUMENTS

| | | | | |
|---|---|---|---|---|
| 3,992,760 A * | 11/1976 | Roberts | ........................ | 29/25.35 |
| 4,243,960 A * | 1/1981 | White et al. | ............. | 29/25.35 X |
| 5,320,865 A * | 6/1994 | Nakahata et al. | ........ | 29/25.35 X |
| 6,516,503 B1 * | 2/2003 | Ikada et al. | .................. | 29/25.35 |
| 6,557,225 B2 * | 5/2003 | Takata et al. | ................. | 29/25.35 |
| 6,601,276 B2 * | 8/2003 | Barber | .......................... | 29/25.35 |
| 7,322,093 B2 | 1/2008 | Kadota et al. | | |
| 7,327,071 B2 | 2/2008 | Nishiyama et al. | | |
| 7,486,001 B2 | 2/2009 | Kando | | |
| 7,522,020 B2 | 4/2009 | Kando | | |
| 7,550,898 B2 | 6/2009 | Kadota et al. | | |
| 7,573,178 B2 | 8/2009 | Inoue et al. | | |
| 7,915,786 B2 | 3/2011 | Matsuda et al. | | |
| 2006/0138902 A1 | 6/2006 | Kando | | |
| 2006/0290233 A1 | 12/2006 | Nishiyama et al. | | |
| 2007/0018536 A1 | 1/2007 | Kadota et al. | | |

(Continued)

FOREIGN PATENT DOCUMENTS

CN  1322059 A  11/2001
CN  1926762 A  3/2007

(Continued)

OTHER PUBLICATIONS

Applicants bring the attention of the Examiner to the following; pending U.S. Appl. No. 12/511,162, filed on Jul. 29, 2009.

(Continued)

*Primary Examiner* — A. Dexter Tugbang
(74) *Attorney, Agent, or Firm* — Chen Yoshimura LLP

(57) ABSTRACT

A method of producing an acoustic wave device includes: forming an interdigital electrode on a piezoelectric substrate; forming a barrier film so as to cover the interdigital electrode; forming a medium on the barrier film; measuring a frequency characteristic of an acoustic wave excited by the interdigital electrode; and forming, in an excitation region, an adjustment region having a thickness different from other portions by patterning the barrier film or further providing an adjustment film. When forming the adjustment region, an area T of the adjusting area is adjusted in accordance with the measured frequency characteristic.

7 Claims, 12 Drawing Sheets

(56) References Cited

U.S. PATENT DOCUMENTS

| | | | |
|---|---|---|---|
| 2007/0210676 | A1 | 9/2007 | Matsuda et al. |
| 2007/0222337 | A1 | 9/2007 | Kadota et al. |
| 2007/0284965 | A1 | 12/2007 | Kadota et al. |
| 2008/0074212 | A1 | 3/2008 | Matsuda et al. |
| 2008/0160178 | A1 | 7/2008 | Nishiyama et al. |
| 2008/0266023 | A1* | 10/2008 | Tanaka .................. 333/193 X |
| 2009/0102318 | A1 | 4/2009 | Kando |
| 2010/0188173 | A1 | 7/2010 | Matsuda et al. |
| 2010/0244624 | A1 | 9/2010 | Matsuda et al. |

FOREIGN PATENT DOCUMENTS

| | | | | |
|---|---|---|---|---|
| CN | 1938946 A | | 3/2007 | |
| JP | 01231411 A | * | 9/1989 | ............... 29/25.35 X |
| JP | 2-301210 A | | 12/1990 | |
| JP | H08-032397 A | | 2/1996 | |
| JP | 2000-341068 A | | 12/2000 | |
| JP | 2006-238211 A | | 9/2006 | |
| JP | 2007-036670 A | | 2/2007 | |
| WO | 2005/069486 A1 | | 7/2005 | |
| WO | WO 2005/083881 A1 | | 9/2005 | |
| WO | WO 2005/093949 A1 | | 10/2005 | |

OTHER PUBLICATIONS

Walsh et al., "Nanoindentation of silicon nitride: A multimillion-atom molecular dynamics study", Applied Physics Letters, Jan. 6, 2003, vol. 82, No. 1, pp. 118-120. Referenced by a US Examiner in a PTO-892 form for a related U.S. Appl. No. 12/511,162.

Japanese Office Action dated on Jun. 28, 2011, in a counterpart Japanese patent application of Application No. 2009-074041. Concise explanation of relevance: the Japanese Office Action rejects claims in the Japanese application in view of Foreign Patent document Nos. 1-5 above.

Chinese Office Action (of related U.S. Appl. No. 12/511,162) in a counterpart Chinese Patent Application No. 200910160971.1, dated Oct. 21, 2011.

Chinese Office Action dated Jun. 4, 2012 in a counterpart Chinese Patent Application No. 200910261121.0. (This Chinese Office Action cites Foreign Patent document Nos. 1-2 above and US4243960 which has been listed by US Examiner in a PTO-892 form).

Chinese Office Action dated Jan. 11, 2013 in a counterpart Chinese Patent Application No. 200910261121.0. (This Chinese Office Action cites CN1938946 and CN1322059, which have been submitted in the previous IDS, as well as US4243960, which has been listed by US Examiner in a PTO-892 form).

* cited by examiner

3MHz (30%)

4MHz (40%)

5MHz (50%)

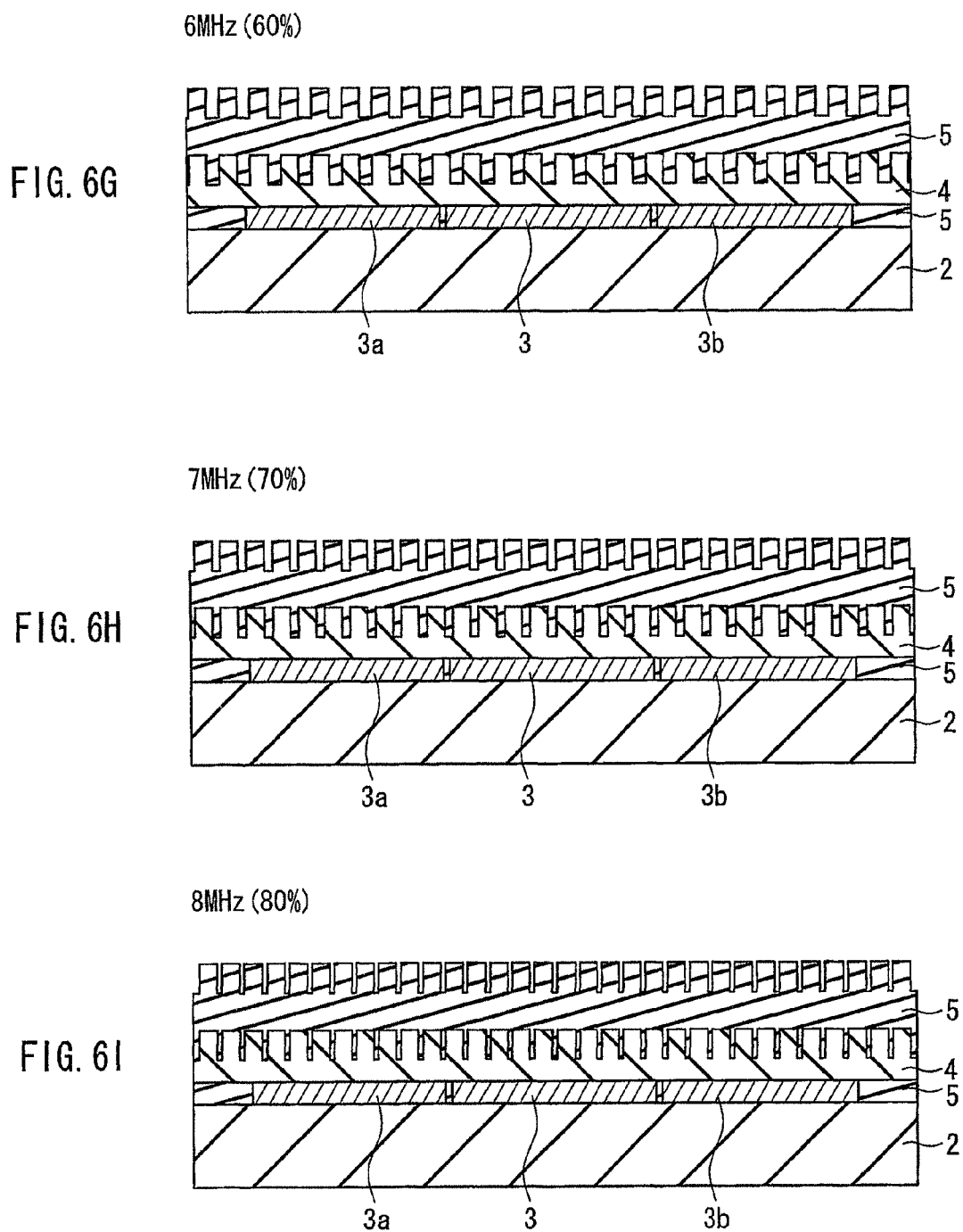

9MHz (90%)

10MHz (100%)

METHOD OF PRODUCING AN ACOUSTIC WAVE DEVICE

CROSS-REFERENCE TO RELATED APPLICATION

This application is based upon and claims the benefit of priority of the prior Japanese Patent Application No. 2009-074041, filed on Mar. 25, 2009, the entire contents of which are incorporated herein by reference.

FIELD

The present invention relates to acoustic wave devices, such as a surface acoustic wave device and a boundary acoustic wave device.

BACKGROUND

A SAW (Surface Acoustic Wave) device has been known as one of the devices that uses an acoustic wave. The SAW device has been used in a variety of circuits that process radio signals in a frequency band of 45 MHz to 2 GHz typified by mobile phones, for example. Examples of the variety of circuits include a transmission band-pass filter, a reception band-pass filter, a local filter, an antenna duplexer, an IF filter and an FM modulator.

As the performance of mobile phones has been enhanced and the sizes of mobile phones have been also reduced in recent years, an improvement in a variety of properties, e.g., an increase in out-of-band suppression and an improvement in temperature stability, and a reduction in device size have been demanded. As a way to improve the temperature stability, a technique of forming a dielectric material, such as $SiO_2$, on an interdigital transducer on a piezoelectric substrate has been developed. Furthermore, a boundary acoustic wave device or the like has been developed. In the boundary acoustic device, a different dielectric material having a higher acoustic velocity is formed on the dielectric material, so that energy is trapped in the boundary between the dielectric materials and the surface of the piezoelectric substrate. Thereby, the device size has been reduced.

Frequency variations due to manufacturing variations could be a common problem to all of these acoustic wave devices. As measures against this problem, a variety of methods for making a frequency adjustment have been disclosed (see Patent documents 1 and 2, for example).

As one example, it has been proposed to make a frequency adjustment by forming a SiN film on an interdigital transducer, a reflector and a piezoelectric substrate using plasma chemical vapor deposition or the like (see Patent document 1, for example). Further, it has been proposed to make a frequency adjustment by forming a SiN layer on a $SiO_2$ layer and physically etching the SiN layer to reduce its thickness or spattering the SiN layer to increase its thickness (see Patent document 2, for example).

Further, it has been proposed to adjust the frequency of a boundary acoustic wave device including an IDT electrode between a first medium and a second medium by changing the thickness of the second medium (see Patent document 3, for example).

Patent document 1; Japanese Laid-open Patent Application No. H2-301210
Patent document 2: WO 2005/083881
Patent document 3: WO 2005/093949

As described above, as a method of making a frequency adjustment, a frequency characteristic is adjusted by etching the medium covering the electrode in the depth direction to adjust the thickness of the medium. For example, in order to bring variations in frequency characteristic between a plurality of acoustic wave devices formed on a single wafer into a desired range by using this method, it is necessary to select a portion of each acoustic wave device on the wafer and adjust the thickness of the medium on the selected portion. For example, the thickness of the medium needs to be adjusted by masking a portion of the wafer and etching a portion of the upper surface of the medium in the depth direction. In this way, an etching amount varies depending on each chip.

In this case, in order to bring the frequency distribution in the wafer surface into a desired range, masking is carried out for each chip, and even in some cases, film formation and etching need to be repeated several times. As a result, problems, such as an increase in the number of processes, arise.

SUMMARY

According to an aspect of the invention, a method of producing an acoustic wave device includes: forming an interdigital electrode having a plurality of electrode fingers on a piezoelectric substrate; forming a barrier film so as to cover the interdigital electrode; forming a medium on the barrier film; measuring a frequency characteristic of an acoustic wave excited by the interdigital electrode; and forming, in an excitation region where an acoustic wave is excited by the interdigital electrode, an adjustment region having a different thickness from other portions by patterning the barrier layer or further providing an adjustment film. When forming the adjustment region, an area T of the adjustment region in the excitation region is adjusted in accordance with the measured frequency characteristic.

The object and advantages of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF DRAWINGS

FIGS. 6B to 6K are cross-sectional views respectively illustrating acoustic wave devices in the regions T1 to T10 illustrated in FIG. 5.

DESCRIPTION OF EMBODIMENTS

Embodiment 1

[Configuration of Acoustic Wave Device]

Figure 1A:
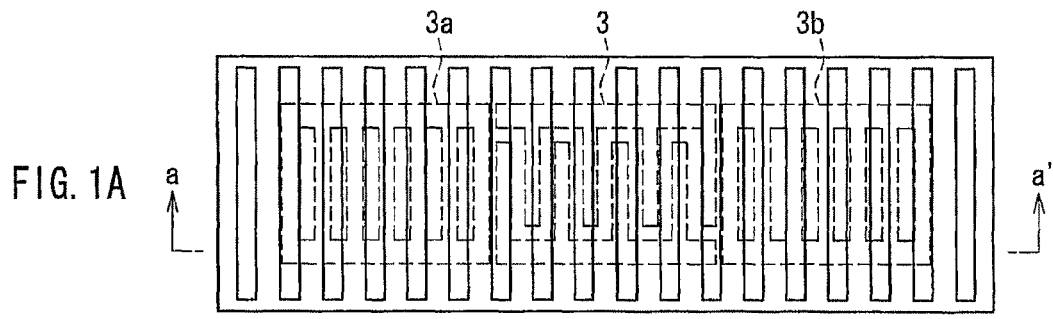
FIG. 1A is a plan view illustrating an acoustic wave device according to Embodiment 1 having a configuration in which the area of a frequency adjustment film occupies 50% of the entire area of excitation regions.
Figure 1B:
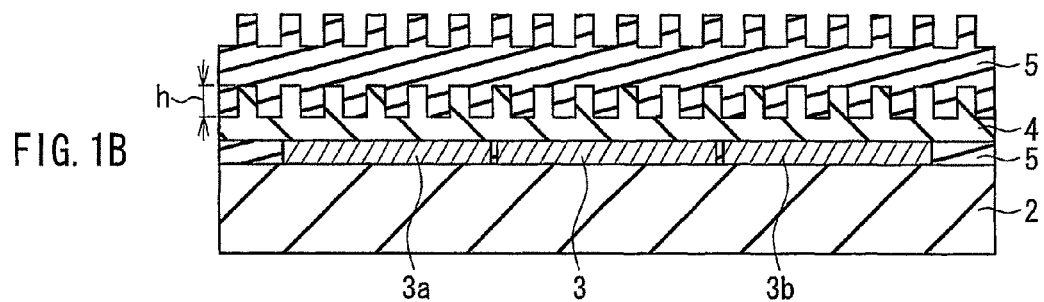
FIG. 1B is a cross-sectional view taken along the line a-a' in FIG. 1A.

FIG. 1A is a plan view illustrating an acoustic wave device according to the present embodiment. FIG. 1B is a cross-sectional view taken along the line a-a' in FIG. 1A.

In the acoustic wave device illustrated in FIGS. 1A and 1B, interdigital transducer 3 having a pair of interdigital electrodes is provided on a piezoelectric substrate 2. Each interdigital transducer has a plurality of electrode fingers. Reflectors 3a and 3b are provided respectively on the both sides of the interdigital transducer 3. The piezoelectric substrate 2 is a LN (LiNbO$_3$) substrate of a rotated Y cut plate, for example. The interdigital transducer 3 has electrodes that excite an acoustic wave. In the interdigital transducer 3, the two interdigital electrodes, for input and output, are disposed so as to oppose each other. The interdigital transducers electrodes are disposed in such a manner that the electrode fingers of one interdigital transducer electrode and those of the other interdigital electrode are aligned in alternate order. In this case, regions occupied by the electrode fingers of the interdigital transducer 3 and spacings between the electrode fingers become excitation regions. The interdigital transducer 3 is also referred to as IDT (Interdigital Transducer), interdigital electrode or comb-shaped electrode. The interdigital transducer 3 and the reflectors 3a and 3b are formed using metal such as Al, Ti, Cu, Au, Ni, Cr, Ta or W.

A SiN film 4 as an example of a barrier film is provided on the piezoelectric substrate 2 so as to cover the interdigital transducer 3. A SiO$_2$ film 5 is provided on the SiN film 4. The SiO$_2$ film 5 is an example of a medium. It is to be noted that the SiO$_2$ film 5 is also provided on the piezoelectric substrate 2 at the portion where the interdigital transducer 3 is not disposed.

As described above, in the acoustic wave device illustrated in FIGS. 1A and 1B, the barrier film (SiN film 4) is provided between the piezoelectric substrate 2 and the medium (SiO$_2$ film 5). The SiO$_2$ film 5 has a lower acoustic velocity than the piezoelectric substrate 2. Therefore, an acoustic wave excited by the interdigital transducer 3 propagates intensively on the interface between the piezoelectric substrate 2 and the SiO$_2$ film 4. Consequently, the acoustic wave device operates as a resonator.

The SiN film 4 has portions (hereinafter referred to as patterned portions) having a thickness larger than other portions. By adjusting the area where the patterned portions of the SiN film 4 and the SiO$_2$ film 5 come into contact with each other, the resonance frequency of the acoustic wave device is adjusted. In other words, the resonance frequency is adjusted by the area of the portions having a larger thickness than other portions in the excitation regions defined by the interdigital transducer 3. According to this configuration, a medium having a different acoustic velocity is formed on the portions where acoustic wave energy is distributed to change the acoustic velocity of the acoustic wave, and thereby making the adjustment. Herein, the volume of the regions where the acoustic wave energy is distributed is determined by the area of the patterned portions of the SiN film, and the adjustment amount of the frequency characteristic of the acoustic wave device is also determined.

During the production, the SiN film 4 is formed entirely (100%) on top of the interdigital transducer 3, and the patterned portions corresponding to a frequency distribution in the wafer are formed on the SiN film 4. In this case, the SiN film 4 includes a cover portion that entirely covers the interdigital transducer 3 and the patterned portions provided on the cover portion. In this production process, it is possible to adjust the frequency distribution in the wafer surface after forming the SiN film 4 entirely (100%) to bring the frequency characteristic of the acoustic wave device on the wafer surface closer to a reference frequency. In other words, on the same piezoelectric substrate (wafer) 2, by forming a pattern on the SiN film 4 so as to have an area distribution corresponding to the frequency distribution in the wafer surface, the frequency distribution in the wafer surface can be adjusted.

In addition to the function as a frequency adjustment film as described above, the SiN film 4 also functions as an anti-diffusion film and an anti-oxidization film in the present embodiment. By allowing the SiN film 4 to have the function of an anti-diffusion film as above, it is possible to perform a frequency adjustment that is more efficient both production-wise and structure-wise.

In the example illustrated in FIGS. 1A and 1B, it is possible to set the area where the patterned portions of the SiN film 4 and the SiO$_2$ film 5 come into contact with each other to be 50% of the entire excitation regions and the total thickness of the patterned portion and the cover portion of the SiN film 4 to be, for example, 10 nm.

Figure 2A:
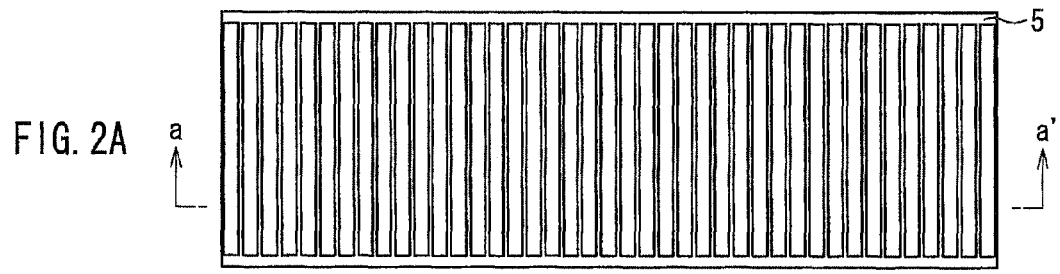
FIG. 2A is a plan view illustrating an acoustic wave device having a configuration in which the area of a frequency adjustment film occupies 75% of the entire area of excitation regions.
Figure 2B:
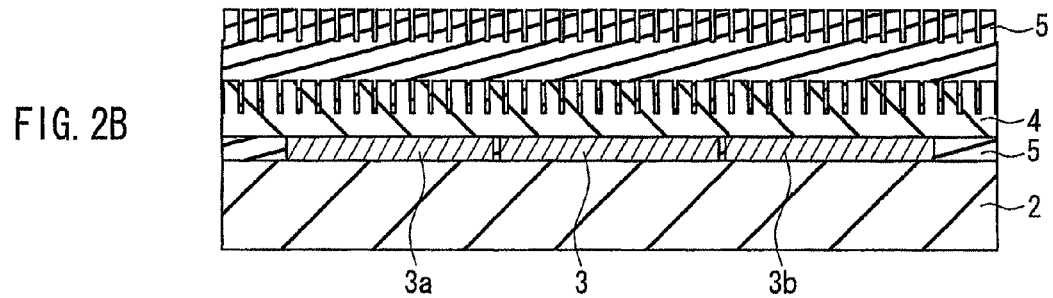
FIG. 2B is a cross-sectional view taken along the line a-a' in FIG. 2A.

FIGS. 2A and 2B are a plan view (2A) and a cross-sectional view (2B) illustrating an acoustic wave device in which the area where the frequency adjustment film and the SiO$_2$ film come into contact with each other is 75% of the entire excitation regions.

Figure 3:
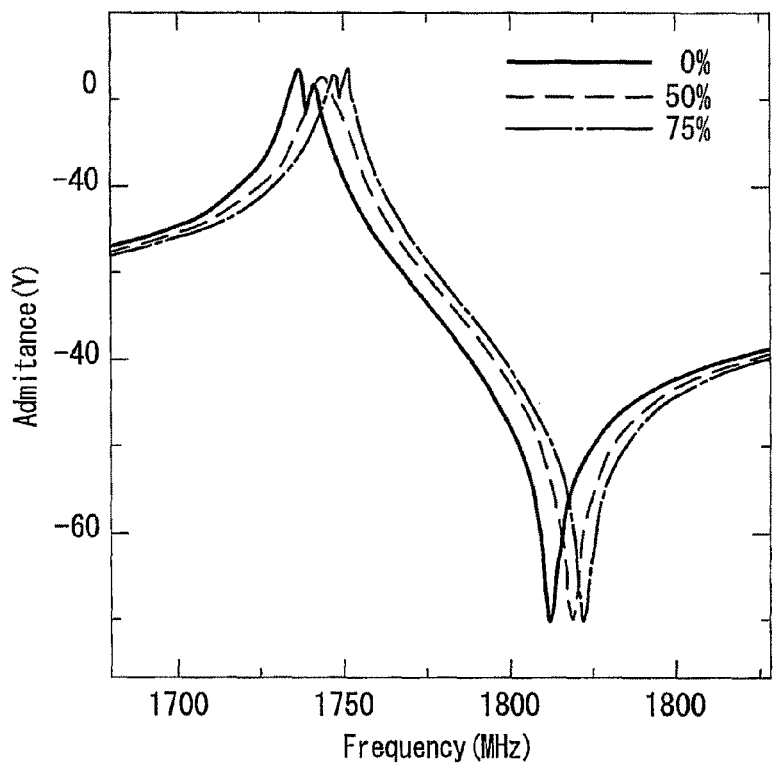
FIG. 3 is a graph illustrating a relationship between the area of a frequency adjustment film and an admittance property.
Figure 4:
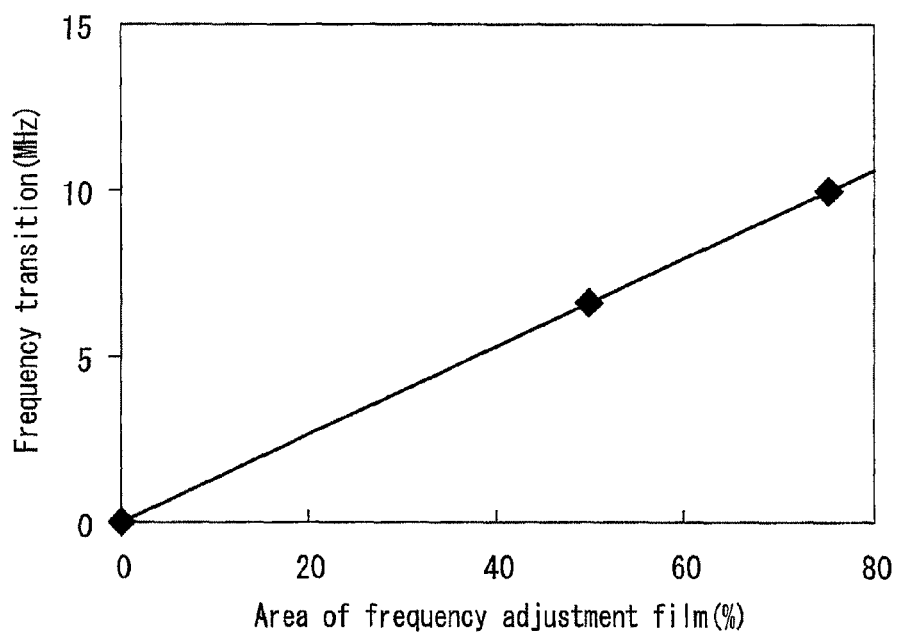
FIG. 4 is a graph illustrating a relationship between the area of a frequency adjustment film and a transition of an antiresonance frequency.

FIG. 3 is a graph illustrating a relationship between the area (0%, 50% and 75%) of the patterned portions of the SiN film 4 and an admittance property. FIG. 4 is a graph illustrating a relationship between the area where the patterned portion formed on the SiN film 4 and the SiO$_2$ film come into contact with each other and a transition of an antiresonance frequency. As can be seen from FIGS. 3 and 4, the resonance frequency and the antiresonance frequency transition towards the high frequency side as the area where the patterned portions of the SiN film 4 and the SiO$_2$ film come into contact with each other increases. From these results, it can be understood that the transition of the frequency increases as the acoustic wave energy distribution in the SiN film and the volume of the distribution increase.

In the example illustrated in FIGS. 1 and 2, although the frequency adjustment film is provided in such a manner that plate-shaped films are disposed regularly (e.g., regularly at a spacing about 2.3 times larger than the distance between the electrode fingers of the interdigital transducer 3), they may not be disposed regularly in this manner.

It is preferable that a thickness h of the patterned portions of the SiN film 4 is 0.01 to 0.05λ. Here, λ represents a wavelength of an acoustic wave.

[Example of Improving Distribution of Frequency Characteristic of Acoustic Wave Device in Wafer Surface]

As described above, the frequency characteristics of the acoustic wave device can be adjusted by patterning the SiN film 4. In the present embodiment, a case where the frequencies of a plurality of acoustic wave devices formed on a single wafer (piezoelectric substrate 2) are adjusted by patterning the SiN film 4 will be described as an example. Here, the area of the SiN film 4 on each acoustic wave device on the wafer is adjusted in accordance with the frequency distribution in the wafer. According to this example, the frequencies of the acoustic wave devices on the wafer can be adjusted by single film formation.

Figure 5:
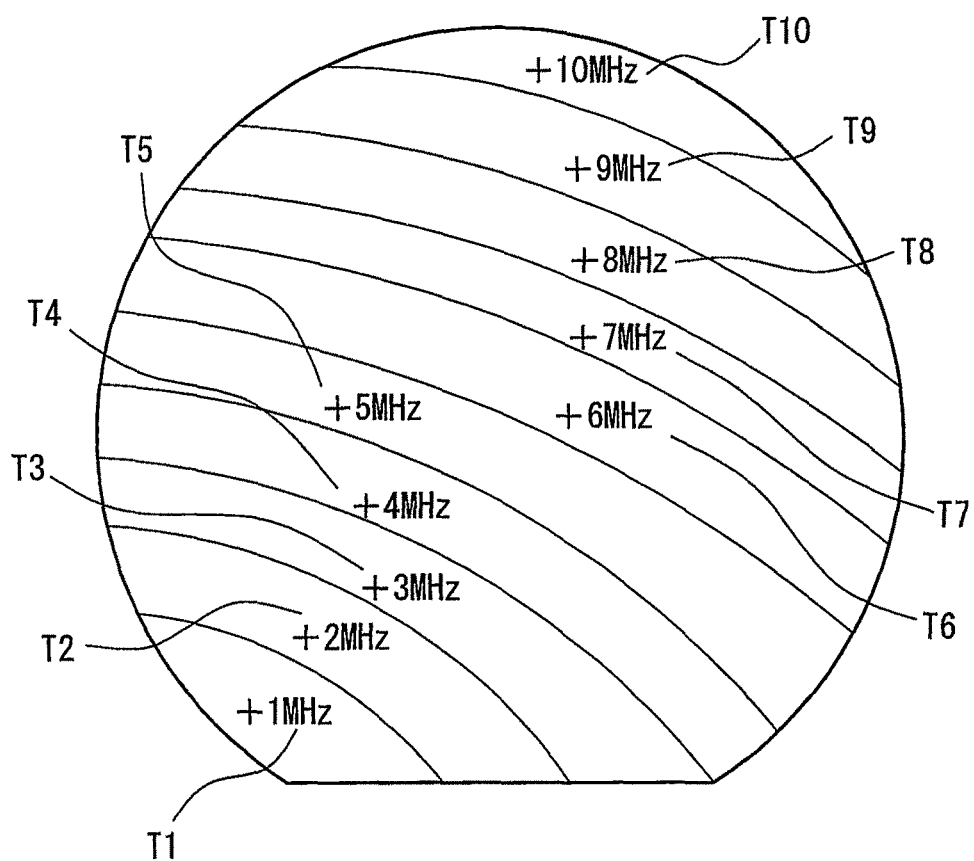
FIG. 5 is a top view illustrating a frequency distribution of an acoustic wave device in a wafer surface.

FIG. 5 is a top view illustrating the frequency distribution of the acoustic wave device in the wafer surface when seen the wafer from the top. The wafer illustrated in FIG. 5 is a piezoelectric substrate such as an LN ($LiNbO_3$) substrate, and a plurality of interdigital electrodes and a $SiO_2$ film are formed on the piezoelectric substrate. Thereby, a plurality of acoustic wave devices that share the same wafer (piezoelectric substrate) are formed. In the end, the wafer is cut into each acoustic wave device. Each acoustic wave device has the structure illustrated in FIG. 1, 2 or 3, for example. For brevity, a case where the acoustic wave devices are resonators will be described. However, each acoustic wave device may constitute a chip such as a filter that includes a plurality of resonators.

Although it is preferable that the plurality of acoustic wave devices formed on the wafer have the same frequency characteristic (e.g., resonance frequency), in reality, the frequency characteristics of the acoustic wave devices in the wafer surface vary from each other in many cases.

FIG. 5 illustrates an example of such a frequency distribution in the wafer surface. In the example in FIG. 5, the regions T1 to T10 are illustrated. In the regions T1 to T10, the resonance frequencies of the acoustic wave devices deviate from a predetermined reference frequency by +1 MHz, +2 MHz, +3 MHz, . . . +10 MHz, respectively. Here, the reference frequency is a preset desired frequency. It is to be noted that FIG. 5 illustrates the frequency distribution prior to forming the SiN film 4. That is, the resonance frequencies of the acoustic wave devices in the regions T1 to T10 are smaller than the reference frequency by 1 to 10 MHz, respectively.

Although the resonance frequency has been used as one example of the frequency characteristics, other frequency characteristics may be used. For example, the frequency characteristics include an antiresonance frequency, a fractional bandwidth and the like.

In accordance with the frequency distribution illustrated in FIG. 5, the area of the patterned portions of the frequency adjustment film (SiN film 4) to be formed on each acoustic wave device on the wafer is adjusted. Specifically, the SiN film 4 formed on each acoustic wave device is provided so as to have a uniform thickness including the patterned portions and the area of the patterned portions is distributed in accordance with the frequency distribution in the surface. As a result, a frequency adjustment amount can be adjusted in accordance with the distribution in the surface. For example, it is possible to reduce the area of the patterned portions of the SiN film 4 for a portion where a frequency adjustment amount is small and to increase the area of the patterned portions for a portion where a frequency adjusting amount is large. Consequently, the acoustic wave energy distribution and the distribution volume in the SiN film 4 can be adjusted without changing the film thickness.

Variations in frequency characteristic in the wafer can be also reduced by forming the SiN film 4 to have a uniform thickness throughout the entire wafer surface and further providing a frequency adjustment film on at least one portion of the SiN film 4. By adjusting the area of the SiN film 4 on which the frequency adjustment film is provided, the frequency characteristic distribution can be adjusted by a single film formation process.

Figure 6A:
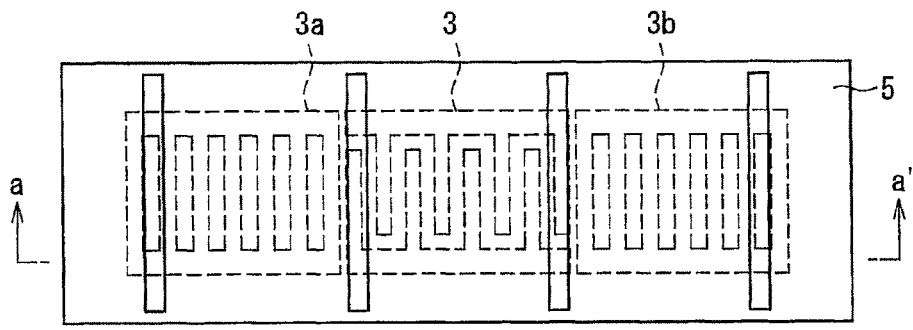
FIG. 6A is a plan view illustrating an acoustic wave device formed on the region T1 of the wafer illustrated in FIG. 5.
Figure 6B:
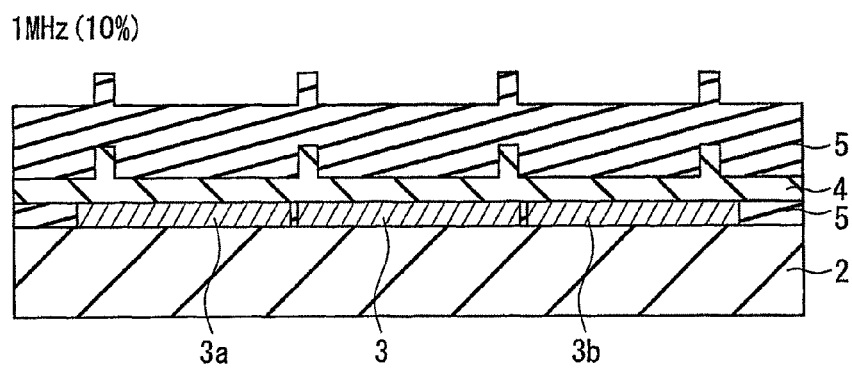

FIG. 6A is a plan view illustrating an acoustic wave device to be formed in the region T1 of the wafer illustrated in FIG. 5. FIGS. 6B to 6J are cross-sectional views respectively illustrating acoustic wave devices in the regions T1 to T10 illustrated in FIG. 5. It is to be noted that FIG. 6B is a cross-sectional view taken along the line a-a' in FIG. 6A. As illustrated in FIGS. 6A and 6B, in the region T1, the SiN film 4 is patterned in such a manner that the area of each patterned portion occupies 10% of each excitation region. In the region T1, the resonance frequency of the acoustic wave device deviates from the reference frequency by −1 MHz. Therefore, by forming each patterned portion of the SiN film 4 to occupy 10% of each excitation region, the resonance frequency of the acoustic wave device in the region T1 can be brought closer to the reference frequency. Here, the excitation regions are regions on the piezoelectric substrate 2 occupied by the electrode fingers of the interdigital transducer 3 and the spacings between the electrode fingers.

Figure 6C:
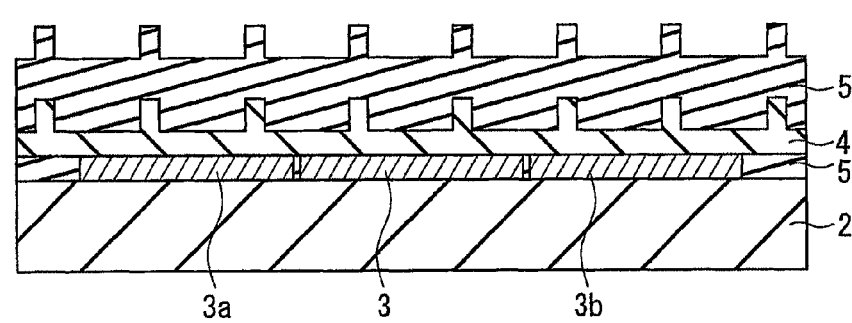
Figure 6D:
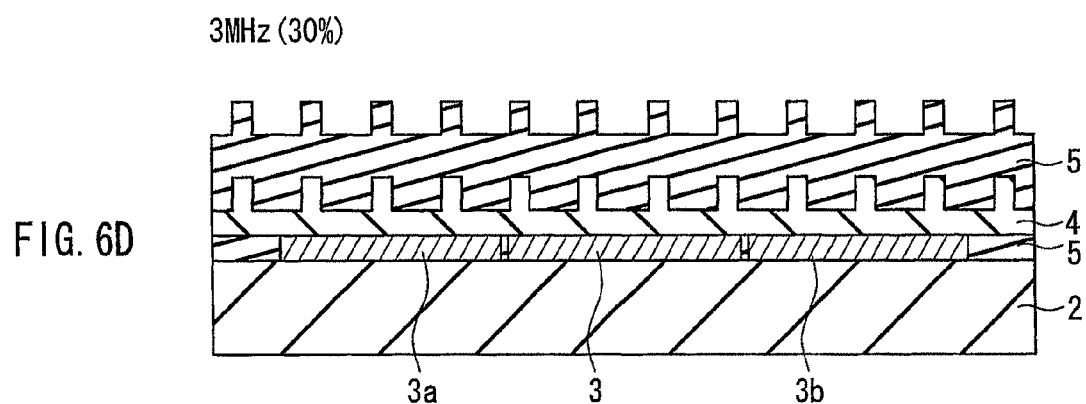
Figure 6E:
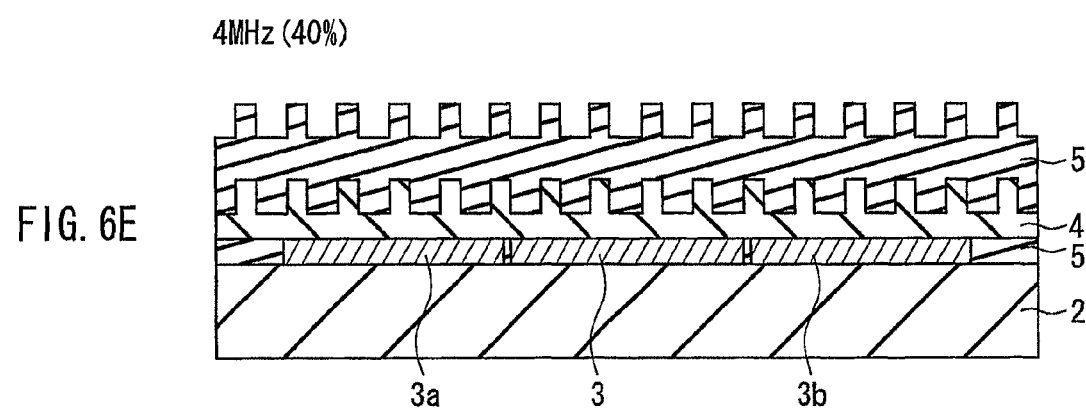
Figure 6F:
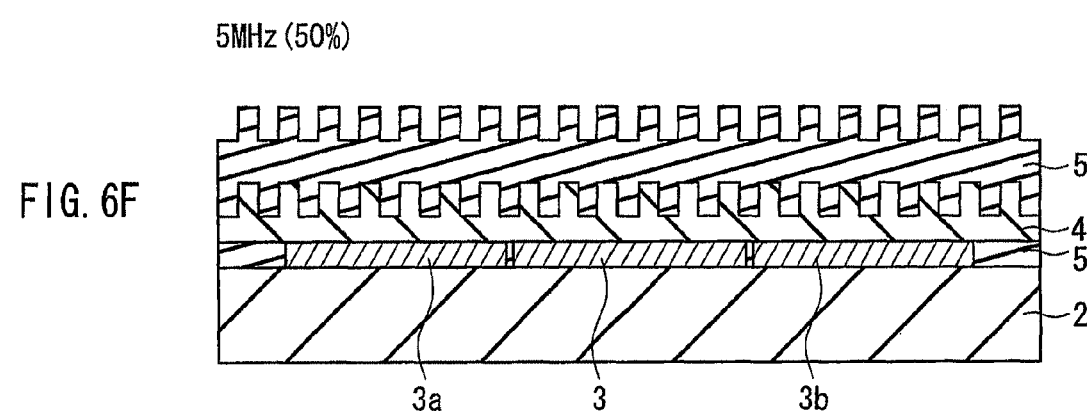
Figure 6J:
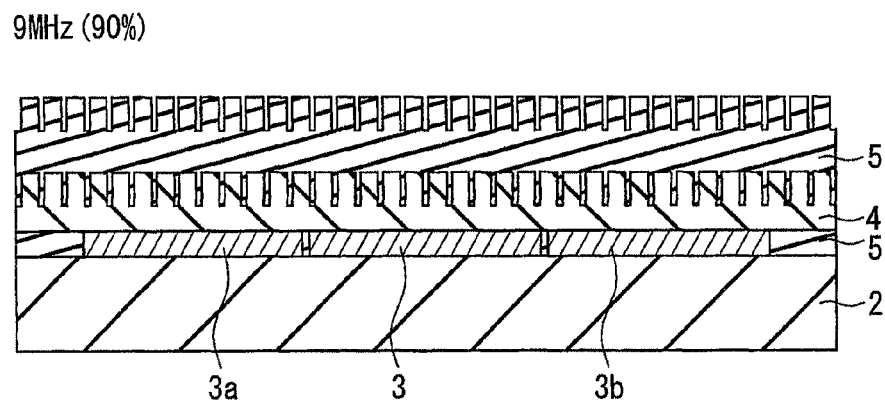
Figure 6K:
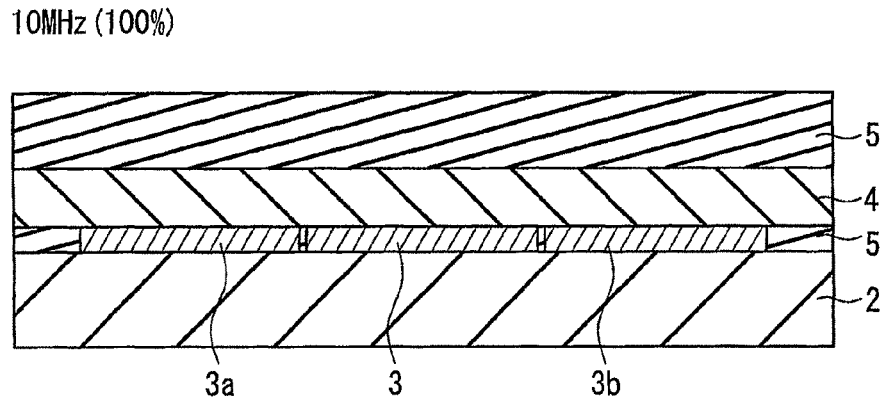

As illustrated in FIG. 6C, in the region T2, the SiN film 4 is patterned in such a manner that the area of each patterned portion occupies 20% of each excitation region. Furthermore, as illustrated in FIGS. 6D to 6K, in the regions T3, T4, T5, T6, T7, T8, T9 and T10, the area of each patterned portion of the SiN film 4 occupies 30%, 40%, 50%, 60%, 70% 80%, 90% and 100% of each excitation region, respectively. The thickness of each pattered portion of the SiN film 4 illustrated in FIGS. 6A to 6K is 7.5 nm.

As described above, the thickness of the patterned portions of the SiN film 4 in the wafer is uniform. On the other hand, the ratio of the area of each patterned portion of the SiN film 4 occupying each excitation region is adjusted in accordance with a drift amount from the reference frequency prior to forming the SiN film 4. Particularly, in this example, the ratio of the area occupied by the patterned portions of the SiN film 4 increases in proportion to the drift amount from the reference frequency. It is to be noted that the frequency characteristic of the acoustic wave device in the wafer can also be adjusted without adjusting the thickness of the SiN film 4 in the above manner.

It is to be noted that the relationship between the area occupied by the patterned portions of the SiN film 4 and the drift amount from the reference frequency is not limited to the proportional relationship as above. The relationship may be represented by a function obtained by an empirical rule. Further, the ratio of the patterned portion of the SiN film 4 in each excitation region can be determined by calculating on a computer using a function in which the difference from the reference frequency is input data and the ratio of the area of the patterned portions is an output. Or, data in which the difference between the resonance frequency and the reference frequency and the area of the patterned portions are associated with each other is recorded on a computer recording medium in advance, and the area of the patterned portions in each region may be determined by using this data.

Further, the area covered by the SiN film 4 may be different between the resonators on the same wafer or between chips on the wafer. For example, the operation frequency may be adjusted on a chip basis. In this case, chips having small variations in frequency characteristic can be obtained on the same substrate. In this way, the adjustment of the acoustic wave device can be made on a resonance basis, a filter basis, a chip basis or a basis in accordance with other purpose.

[Production Method]

Figure 7A:
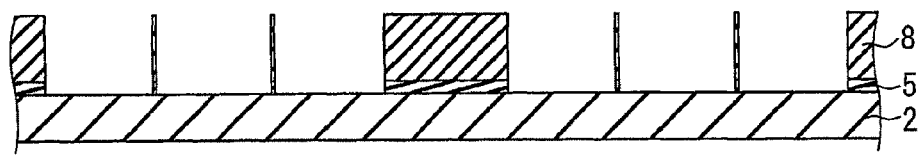
FIGS. 7A to 7D are diagrams illustrating production processes of an acoustic wave device to be formed on a wafer.
Figure 7B:
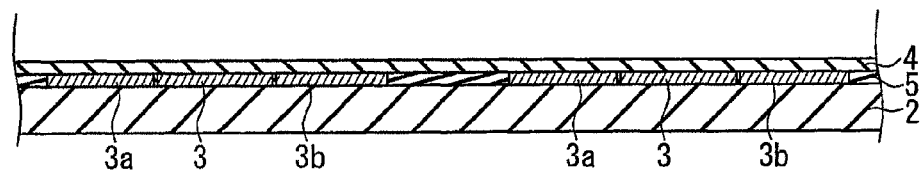
Figure 7C:
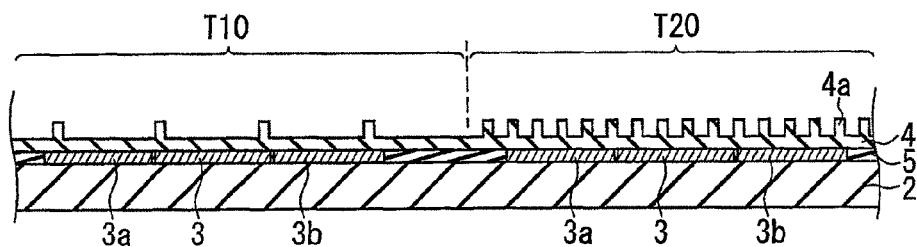

Next, a method of producing the acoustic wave devices illustrated in FIGS. 5 and 6 will be described. FIGS. 7A to 7C each illustrates a production process of an acoustic wave device to be formed on a wafer. For brevity, the wafer is illustrated only partially in FIGS. 7A to 7C.

As shown in FIG. 7A, first, the $SiO_2$ film 5 is formed on the piezoelectric substrate 2 as a wafer by vapor deposition, spattering, firing or the like. The $SiO_2$ film 5 is patterned in a desired shape by etching using a patterned photoresist 8 as a mask. Then, the electrodes 3 and the reflectors 3a and 3b are formed by vapor deposition, spattering or the like. As a result, a desired electrode shape is obtained by removing the photoresist. Next, the SiN film 4 to be the barrier film (anti-diffusion film) is formed on the $SiO_2$ film 5 and the electrodes 3. The SiN film 4 is formed by spattering, chemical vapor deposition (CVD) or the like.

Consequently, the acoustic wave devices (e.g., resonators) are formed respectively in regions T10 and T20. Then, a part (not shown) of the SiN film 4 located on each interdigital electrode 3 is removed to partially expose the interdigital electrodes 3. Each interdigital electrode 3 is divided into input and output electrodes.

Next, a test terminal of a wafer prove is brought into contact with the exposed electrode to measure the resonance frequency of each resonator. For example, a difference (frequency drift) between the resonance frequency of each resonator and a desired reference frequency is measured. As a result, the frequency distribution of the resonators on the wafer is obtained. For example, it is assumed that the frequency drift in the region T10 is 3 MHz and the frequency drift in the region T20 is 10 MHz.

Then, as shown in FIG. 7C, a SiN film 4a as a frequency adjusting film having a pattern corresponding to the above frequency distribution is formed. The SiN film 4a is patterned in such a manner that its area becomes 10% of the total area of the region T10 and 50% of the total area of the region T20. The SiN film 4a is formed by, for example, spattering and then is lifted off. Or, the pattern may be formed by etching.

Figure 7D:
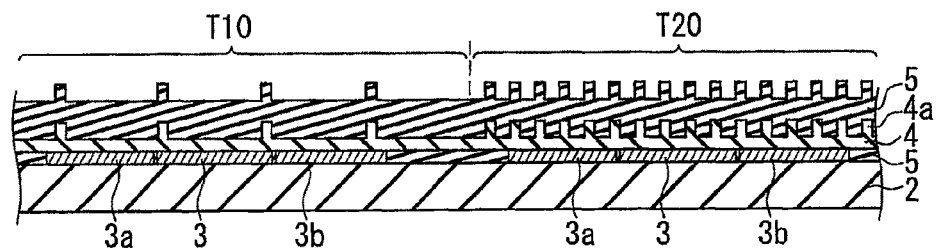

Next, as shown in FIG. 7D, by forming a $SiO_2$ film 5, the acoustic wave devices are formed. The pattern of the SiN film 4a having a function as a frequency adjustment film is reflected upon the surface of the $SiO_2$ film 5.

As described above, in the present embodiment, the volume of the SiN film 4a as a frequency adjustment film, in other words, the frequency adjustment amount is adjusted in accordance with the distribution in the surface by forming the SiN film 4a such that its thickness becomes uniform and the area that covers the interdigital transducer 3 is distributed in accordance with the frequency distribution in the surface. Therefore, the SiN film 4a can be formed by single film formation and etching. In other words, the distribution in the surface can be improved by single film formation and etching. As a result, an acoustic wave device with reduced frequency variations in the surface can be produced through a small number of production processes.

Further, in the present embodiment, the frequency is adjusted prior to forming the $SiO_2$ film 5 as a medium. Thus, it is possible to reduce variations in frequency characteristic in the wafer surface at the early stage. Consequently, it is possible to prevent an accident such as variations in frequency characteristic in the wafer surface after forming the $SiO_2$ film 5 becoming too large and making the adjustment impossible.

Moreover, since the SiN film 4a is provided on the SiN film 4 prior to forming the $SiO_2$ film 5, the frequency characteristic distribution in the wafer surface can be adjusted by providing a frequency adjustment film again after forming the $SiO_2$ film 5. As a result, it is possible to adjust the frequency with higher precision.

It is to be noted that the method of measuring the frequency distribution is not limited to directly measuring the resonance frequencies of the resonators formed on the same wafer as described above. For example, the frequency distribution can be obtained by mapping the thickness distribution of the acoustic wave devices on the wafer. The thickness of the acoustic wave device may be measured using an X-ray fluorescence analyzer.

Or, when producing batches of a plurality of wafers, a desired frequency distribution in the wafers may be achieved on the basis of the information on the frequency distribution of an already-obtained wafer.

Modified Example

Figure 8A:
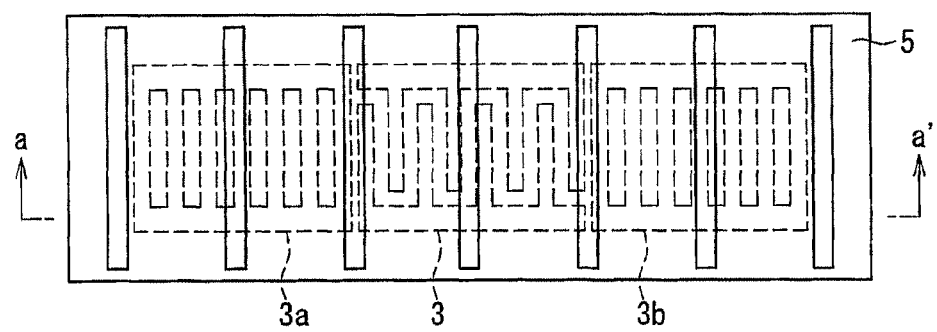
FIG. 8A is a plan view illustrating an acoustic wave device according to Modified Example 1 of Embodiment 1.
Figure 8B:
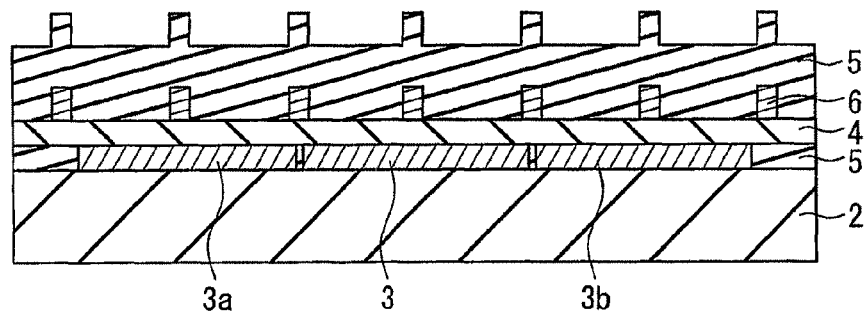
FIG. 8B is a cross-sectional view taken along the line a-a' in FIG. 8A.

FIG. 8A is a plan view illustrating an acoustic wave device according to a modified example of the present embodiment. FIG. 8B is a cross-sectional view taken along the line a-a' in FIG. 8A. In the example illustrated in FIGS. 8A and 8B, a frequency adjustment film 6 is provided on the SiN film 4. For the frequency adjustment film 6, a film other than a SiN film, such as a Si film, an $Al_2O_3$ film, an SiC film, a DLC film or the like, may be used. On the same piezoelectric substrate 2 (wafer), by patterning the frequency adjustment film 6 so as to have an area distribution corresponding to the frequency distribution in the wafer surface, the frequency distribution in the surface can be adjusted.

The frequency adjustment film 6 having an area distribution is formed by spattering and is patterned by lift-off or etching. A film having excellent thickness control can be formed.

The acoustic wave device illustrated in FIGS. 8A and 8B may be used as an acoustic wave device using a Love wave.

Embodiment 2

Figure 9A:
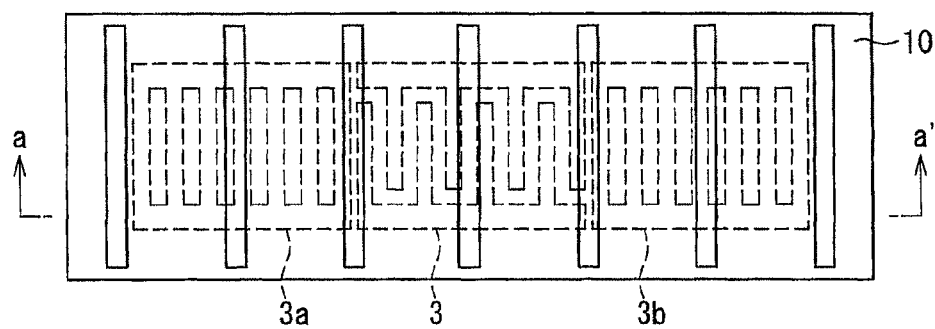
FIG. 9A is a plan view illustrating an acoustic wave device according to Embodiment 2.
Figure 9B:
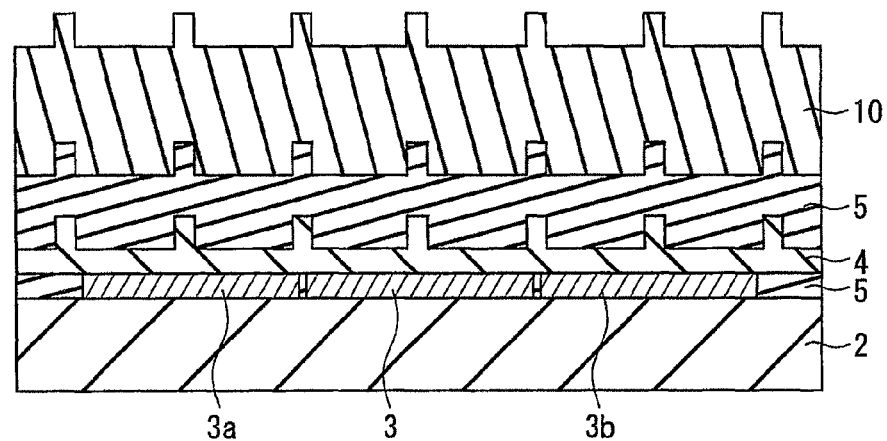
FIG. 9B is a cross-sectional view taken along the line a-a' in FIG. 9A.

FIG. 9A is a plan view illustrating an acoustic wave device according to the present embodiment, and FIG. 9B is a cross-sectional view taken along the line a-a' in FIG. 9A. In the configuration illustrated in FIGS. 9A and 9B, interdigital transducer 3 and reflectors 3a and 3b, all of which are made of a conductive material such as Cu, are formed on the piezoelectric substrate 2. The SiN film 4 is formed so as to cover the interdigital transducer 3 and the reflectors 3a and 3b, and on the SiN film 4, patterned portions as a frequency adjustment film are formed. Furthermore, the $SiO_2$ film 5 is formed so as to cover the SiN film 4 and the $Al_2O_3$ film 10 is formed so as to cover the $SiO_2$ film 5. The pattern of the SiN film 4 is reflected upon the $SiO_2$ film 5 and the $Al_2O_3$ film 10. Due to these films, portions having a thickness larger than other portions are generated in the excitation regions. In other words, portions where the patterned portions of the SiN film 4 come into contact with the $SiO_2$ film 5 have a larger thickness than other portions.

As described above, in the acoustic wave device of the present embodiment, the barrier film (SiN film 4) is provided so as to cover the interdigital transducer 3 on the piezoelectric substrate 2, and on the barrier film, the first medium ($SiO_2$ film 5) and the second medium ($Al_2O_3$ film 10) are provided. Since the frequency is adjusted by patterning the barrier film, variations in frequency characteristic after providing the first medium and the second medium can be suppressed. As a result, after forming the first medium and the second medium, the frequency characteristic adjustment may not be needed or the adjustment becomes easy. As a result, the frequency can be adjusted efficiently.

The acoustic wave device illustrated in FIGS. 9A and 9B may be used as a boundary acoustic wave device, for example. It is to be noted that the combination of the first medium and the second medium is not limited to the $SiO_2$ film and the $Al_2O_3$ film as in the above example. For example, a $SiO_2$ film may be used for the first medium and a SiN film may be used for the second medium. In this way, for the second medium, it is preferable to use a material having an acoustic velocity higher than the material used for the first medium.

Embodiment 3

Figure 10A:
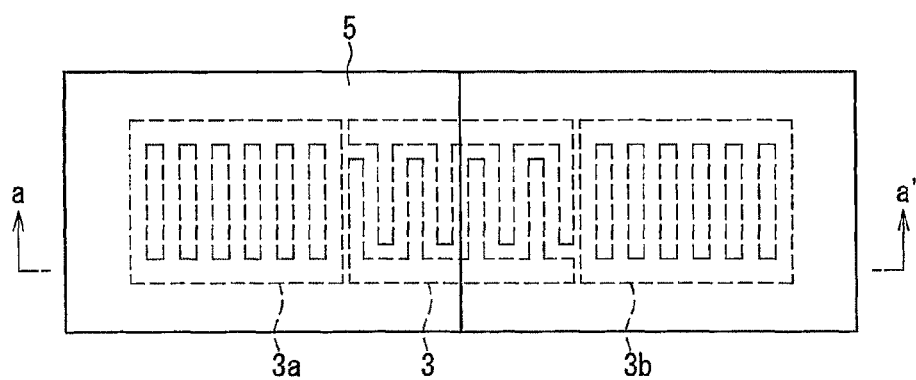
FIG. 10A is a plan view illustrating an acoustic wave device according to Embodiment 3.
Figure 10B:
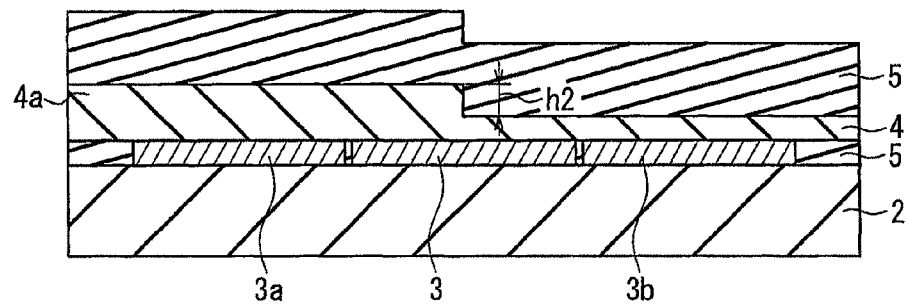
FIG. 10B is a cross-sectional view taken along the line a-a' in FIG. 10A.

FIG. 10A is a plan view illustrating an acoustic wave device according to the present embodiment. FIG. 10B is a cross-sectional view taken along the line a-a' in FIG. 10A. In the example illustrated in FIGS. 10A and 10B, the frequency adjusting SiN film 4a is provided so as to come into contact with the left half of the entire area. In this case, the area of the SiN film 4a occupies 50% of the $SiO_2$ film 4. Thus, the area of the SiN film 4a occupies 50% of the excitation regions. The SiN film 4a is formed such that its thickness h2 becomes 20 nm, for example.

In Embodiments 1 to 2, patterning is carried out such that the portions having a larger thickness than other portions are distributed equally in the excitation regions. However, as illustrated in FIGS. 10A and 10B, the SiN film 4a may be provided so as to concentrate on one portion. Even in that case, the frequency of the acoustic wave device is similarly adjusted by adjusting the area of the SiN film 4a.

In a case where the thickness of the SiN layer 4a is large, an unwanted wave may emerge near the resonance frequency when the frequency adjustment film is provided to concentrate on one portion as illustrated in FIGS. 10A and 10B. Thus, the characteristics may be deteriorated. In this case, as described in Embodiments 1 and 2, the characteristics may be prevented from deteriorating by providing the SiN film 4a so as to be distributed in the excitation regions. Further, the SiN film 4a may be disposed regularly (cyclically) or irregularly (randomly).

Embodiment 4

Figure 11:
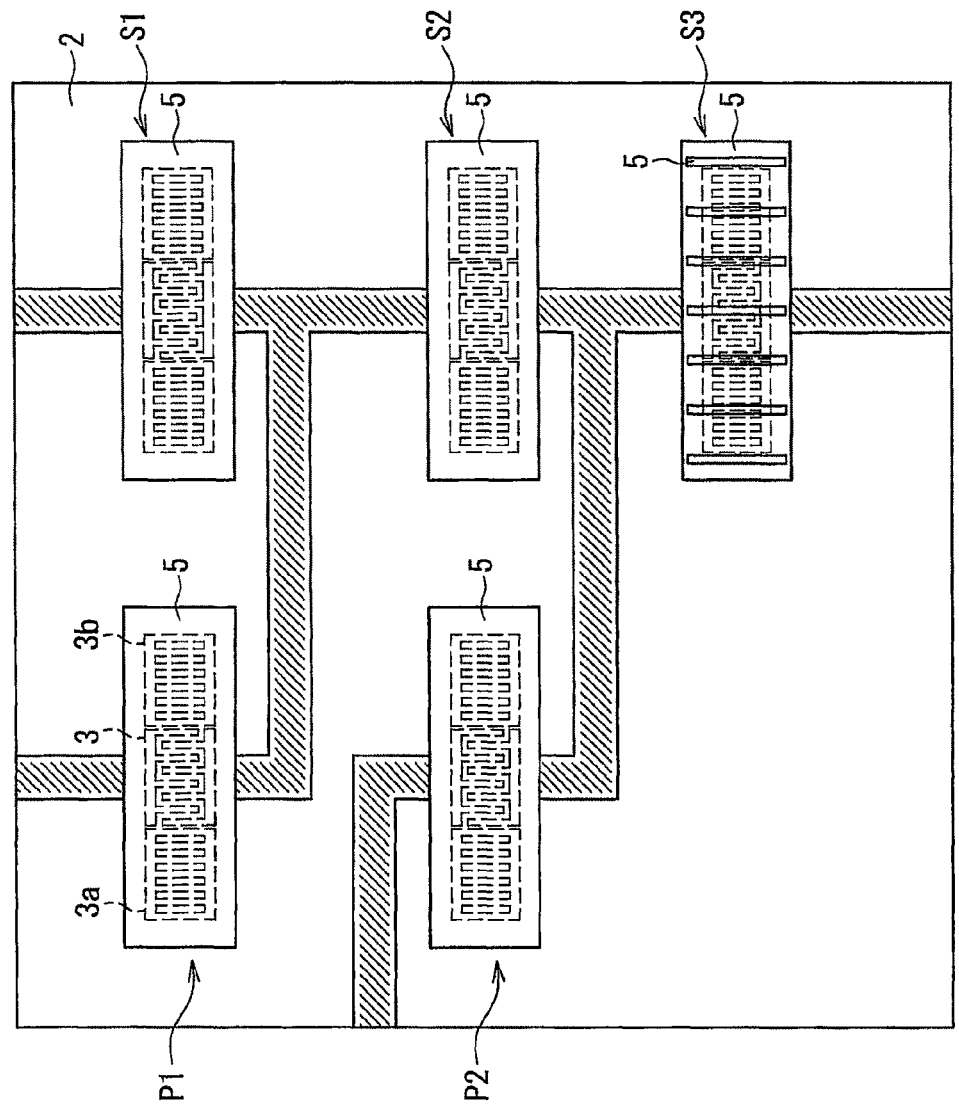
FIG. 11 is a plan view illustrating acoustic wave devices constituting a ladder filter according to Embodiment 4.

FIG. 11 is a plan view illustrating acoustic wave devices that constitute a ladder filter according to the present embodiment. The filter includes series resonators S1 to S3, parallel resonators P1 and P2 and a wiring pattern for connecting these resonators with each other. The series resonators S1 to S3, the parallel resonators P1 and P2, and the wiring pattern are provided on the piezoelectric substrate 2. For example, each resonator has a configuration in which the interdigital transducer 3 and the reflectors 3a and 3b are provided on the piezoelectric substrate 2, the SiN film 4 (barrier film) is provided so as to cover the substrate, the electrodes and the reflectors, and the $SiO_2$ film 4 is provided on the SiN film.

In the example illustrated in FIG. 11, among the plurality of resonators S1 to S3 and P1 and P2 that constitute a filter, patterned portions as a frequency adjustment film is provided on the series resonator S3 so as to come into contact with the SiN film 4. This configuration can be set similarly to the acoustic wave device of Embodiment 1, for example.

In this way, by providing some of the resonators constituting the filter with a frequency adjustment film, the frequencies of the some of the resonators can be only adjusted. By only adjusting the frequencies of the some of the resonators in this way, the fractional bandwidth of the filter can be adjusted. By using this technique, a fractional bandwidth drift in the surface can be reduced.

For example, in a case of a ladder filter, each resonator may have a different frequency from each other. For example, among the series resonators, when a resonator having the highest antiresonance frequency is responsible for the right side characteristic of the filter, the fractional bandwidth can be increased or reduced only by adjusting the frequency of this resonator.

The number of resonators on which the frequency adjustment film is provided is not limited to the example illustrated in FIG. 11 and the film may be provided on a plurality of resonators among the resonators S1 to S3 and P1 and P2. In this case, the filter characteristics can be adjusted by changing the area of the frequency adjustment film (e.g., the patterned portions of the SiN film 4) on a resonator basis.

Effects of Embodiment, etc.

The method of producing an acoustic wave device according to the disclosure of the specification includes: forming an interdigital electrode having a plurality of electrode fingers on a piezoelectric substrate; forming a barrier film so as to cover the interdigital electrode; forming a medium on the barrier film; measuring a frequency characteristic of an acoustic wave excited by the interdigital electrode; and forming, in an excitation region where an acoustic wave is excited by the interdigital electrode, an adjustment region having a different thickness from other portions by patterning the barrier layer or further providing an adjustment film. When forming the adjustment region, an area T of the adjustment region in the excitation region is adjusted in accordance with the measured frequency characteristic.

In the above production method, the barrier layer is formed so as to cover the interdigital electrode and the adjustment region having a different thickness from other portions is formed in the excitation region by patterning the barrier layer or providing the adjustment film. When forming the adjustment region, the area T of the adjustment region in the excitation region is adjusted. As a result, the frequency characteristic of an acoustic wave excited by the interdigital electrode is adjusted. In other words, without changing the thickness (with the same thickness) of the adjusting medium, the distribution amount of acoustic wave energy and the distribution volume can be adjusted by changing the area of the adjusting medium. Therefore, since there is need to adjust the thickness of the adjusting medium, it is possible to provide an acoustic wave device whose frequency characteristic is adjusted through a small number of processes. Further, the barrier layer is formed prior to forming the adjustment region, the area T can be adjusted with ease when forming the adjustment region.

In the method of producing an acoustic wave device according to the disclosure of the specification, when forming the interdigital electrode, interdigital electrodes corresponding to a plurality of acoustic wave devices may be formed on the piezoelectric substrate, when measuring the frequency characteristic, a distribution of a frequency characteristic of the plurality of acoustic wave devices may be measured, and when forming the adjustment region, the adjustment region may be formed such that the area T varies in accordance with the frequency characteristic distribution of the plurality of acoustic wave devices.

For example, when forming a plurality of acoustic wave devices having a desired frequency characteristic (resonance frequency and/or antiresonance frequency) on the same piezoelectric substrate, the frequency characteristic may vary from each other depending on where the acoustic wave devices are to be formed on the piezoelectric substrate. In this case, the frequency characteristic of each acoustic wave device can be adjusted by forming the adjustment region having the area T suited to the acoustic wave device in accordance with the frequency characteristic distribution. In this case, all the acoustic wave devices formed on the piezoelectric substrate can be adjusted by patterning the barrier layer or forming the adjustment film (single film formation). Therefore, the number of processes required for forming films can be reduced in comparison with the case where an adjustment is made by changing the thickness of an adjustment medium. That is, by forming the adjustment medium so as to have different areas T among the acoustic wave devices on the piezoelectric substrate, the frequency characteristic can be adjusted through a small number of processes.

In the method of producing an acoustic wave device according to the disclosure of the specification, when measuring the frequency characteristic, a frequency characteristic of each acoustic wave device on the piezoelectric substrate may be measured, and when forming the adjustment region, the area T of the adjustment region may be determined on the basis of a difference between the measured frequency characteristic of the acoustic wave device and a predetermined reference frequency characteristic.

As a result, it is possible to bring the frequency characteristics of the acoustic wave devices on the piezoelectric substrate closer to the reference frequency characteristic. Here, the frequency characteristic at the time when a voltage is applied to the interdigital electrode of the acoustic wave device is measured, for example. When the acoustic wave devices are resonators, for example, resonance frequencies or antiresonance frequencies may be measured. Further, when the acoustic wave devices are filters, a center frequency may be measured.

The acoustic wave device according to the disclosure of the specification includes: a piezoelectric substrate; an interdigital electrode including a plurality of electrode fingers and provided on the piezoelectric substrate; a barrier film provided so as to cover the interdigital electrode; a medium provided on the barrier film; and an adjustment film including, in an excitation area where an acoustic wave is excited by the interdigital electrode, an adjustment region having a different thickness from other portions. An area T of the adjustment film varies in accordance with a frequency characteristic of an acoustic wave excited by the interdigital electrode.

The acoustic wave device according to the disclosure of the specification may be configured such that a plurality of acoustic wave devices are formed on the piezoelectric substrate by the interdigital electrodes, and the area T of the adjustment film varies in accordance with a frequency characteristic distribution of the plurality of acoustic wave devices.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the sprit and scope of the invention.

The invention claimed is:

1. A method of producing an acoustic wave device, comprising:
    forming an interdigital transducer having a pair of comb-shaped electrodes on a piezoelectric substrate;
    forming a barrier film so as to cover the interdigital transducer;
    forming a medium on the barrier film;
    measuring a frequency characteristic of an acoustic wave excited by the interdigital transducer;
    forming, within an excitation region directly over the pair of comb-shaped electrodes where the acoustic wave is excited by the pair of comb-shaped electrodes, an adjustment region having a surface area T as viewed from a top view and a thickness different from other portions of the excitation region in the same layer of the barrier film by patterning the barrier film or further providing an adjustment film; and
    adjusting a frequency characteristics of the acoustic wave by adjusting the surface area T of the adjustment region when forming the adjustment region.

2. The method of producing an acoustic wave device according to claim 1, wherein
    when forming the interdigital transducer, interdigital transducers corresponding to a plurality of acoustic wave devices are formed on the piezoelectric substrate,
    when measuring the frequency characteristic, a distribution of a frequency characteristic of the plurality of acoustic wave devices is measured, and
    when forming the adjustment region, the adjustment region is such that the surface area T varies in accordance with the frequency characteristic distribution of the plurality of acoustic wave devices.

3. The method of producing an acoustic wave device according to claim 1, wherein
    when measuring the frequency characteristic, a frequency characteristic of each acoustic wave device on the piezoelectric substrate is measured, and
    when forming the adjustment region, the surface area T of the adjustment region is determined on the basis of a difference between the measured frequency characteristic of the acoustic wave device and a predetermined reference frequency characteristic.

4. The method of producing an acoustic wave device according to claim 1, wherein the step of adjusting includes adjusting the surface area T of the adjustment region without adjusting the thickness of the adjustment region.

5. The method of producing an acoustic wave device according to claim 4, wherein the step of adjusting includes adjusting the ratio of the surface area T of the adjustment region relative to a surface area of the excitation region.

6. The method of producing an acoustic wave device according to claim 1, wherein the step of adjusting includes adjusting the ratio of the surface area T of the adjustment region relative to a surface area of the excitation region.

7. The method of producing an acoustic wave device according to claim 1, wherein in the step of adjusting the frequency characteristics of the acoustic wave, the surface area T of the adjustment region is adjusted without changing the thickness of the adjustment region.

* * * * *